Aug. 16, 1966 G. J. VETH 3,267,249

OPTICAL SOLDERING TECHNIQUE AND APPARATUS

Filed Sept. 26, 1963 3 Sheets-Sheet 1

INVENTOR
George J. Veth

BY Bacon & Thomas

ATTORNEYS

OPTICAL SOLDERING TECHNIQUE AND APPARATUS

Filed Sept. 26, 1963 3 Sheets-Sheet 2

INVENTOR
George J. Veth

BY Bacon & Thomas
ATTORNEYS

OPTICAL SOLDERING TECHNIQUE AND APPARATUS

Filed Sept. 26, 1963 3 Sheets-Sheet 3

INVENTOR
George J. Veth
BY Bacon & Thomas
ATTORNEYS 3,267,249

OPTICAL SOLDERING TECHNIQUE AND APPARATUS

George J. Veth, Ellicott City, Md., assignor to the United States of America as represented by the Secretary of the Navy Filed Sept. 26, 1963, Ser. No. 311,822
3 Claims. (Cl. 219—85)

This invention relates generally to a soldering technique and an apparatus for making soldered connections by utilizing a radiant energy heat source. More particularly, it relates to an improved technique for soldering, using radiant energy and requiring no physical contact between a heat source and a soldered connection, and to unique apparatus for use in practicing the technique.

Modern electronic technology often requires packaging electronic components so that the occupy a very small space. A packaging technique has recently been devised to satisfy this need, wherein electronic elements, such as transistors, are sandwiched between printed circuit boards to comprise an electronic module. A plurality of modules is then interconnected to form the circuitry of an electronic device, such as a computer. One of the main advantages, aside from compactness in packaging, is that each module can be easily disconnected from the others and replaced, thus greatly facilitating repair and alteration of the circuit of which the module is a part.

In assembling electric modules, and other like electronic components, a soldered connection is commonly utilized. When component lead conductors are unusually small and geometrically precise printed circuit boards are utilized, the making of a soldered joint is often difficult. The physical clearances between the elements under these conditions are frequently too confining to allow for proper manipulation of conventional soldering equipment, and in addition the relatively thin and easily damaged printed circuitry on the boards must be protected against damage from overheating. Thus, a need has existed for a soldering technique especially adaptable for use with miniature electronic components.

The soldering technique of the present invention utilizes radiant energy for effecting melting of solder to make a connection, and requires no physical contact between the heat source and the soldered joint. In the method of the invention, the workpiece to be soldered are held in a suitable jig with a body or solder disposed thereon, and radiant energy emanating from a suitable source is formed into a concentrated beam and focused on the region of the desired connection by an optical system, the concentrated radiant energy generating sufficient heat to effect melting of the solder and consequent making of the connection.

The novel apparatus for use in practicing the present soldering technique comprises a source of infra red and visible radiant energy, such as a conventional arc lamp, and an optical system for forming the radiant energy emanating from the source into a concentrated beam. The optical system is constructed to focus the concentrated radiant energy into a small spot on the workpieces in the region of the desired soldered connection, and means are provided for controlling the intensity of the radiant energy focused on the connection.

While numerous optical arrangements can be devised for concentrating radiant energy emanating from a source, the preferred embodiment of the present invention utilizes a simple two-element lens system. The first lens functions to collimate the radiant energy as it emanates from the source, which collimated energy is then reflected through a focusing lens toward the workpieces.

The means in the present invention for controlling the intensity of the radiant energy impinging on the workpieces can assume several possible configurations, but in the preferred embodiment of the invention comprises a shutter mechanism and associated control equipment. The shutter is positioned between the two elements of the optical system, and functions in one position thereof to offer substantially no obstruction to the passage of radiant energy from the source. The shutter includes a thin plate having a central aperture therein, and when the shutter is positioned in a second position with the frontal area of the plate presented toward the source, said plate will block the passage of all the radiant energy except for a small amount that passes through said aperture; the small amount of radiant energy passing through the aperture functions to facilitate proper positioning of the workpieces relative to the optical soldering apparatus.

It is an object of the present invention to provide a soldering technique whereby a solder connection can be made utilizing radiant energy, and without requiring physical contact between a heat source and the region of the connection.

Another object is to provide a soldering technique whereby precise control can be maintained over the soldering temperature.

A further object is to provide a soldering technique for effecting a soldered connection within a confined, small area.

It is also an object to provide apparatus for use in practicing the optical soldering technique of the invention, constructed to focus radiant energy into a relatively small region on workpieces to be connected.

Another object is to provide optical soldering apparatus incorporating means to control with time the intensity of concentrated radiant energy focused on the soldering region, said means being readily operable to provide preselected, precisely controlled soldering time periods.

It is also an object to provide soldering apparatus incorporating means for holding the workpieces to be soldered, said holding means being movable in three mutually perpendicular directions for readily positioning the soldering region relative to a beam of radiant energy.

Still another object is to provide optical soldering apparatus constructed for either manual or automatic operation, and adaptable for repeatedly making soldered connections.

Other objects and many of the attendant advantages of the present invention will be readily appreciated as the same becomes better understood by reference to the following detailed description, when considered in connection with the accompanying drawings, wherein.

Figures 1, 2:
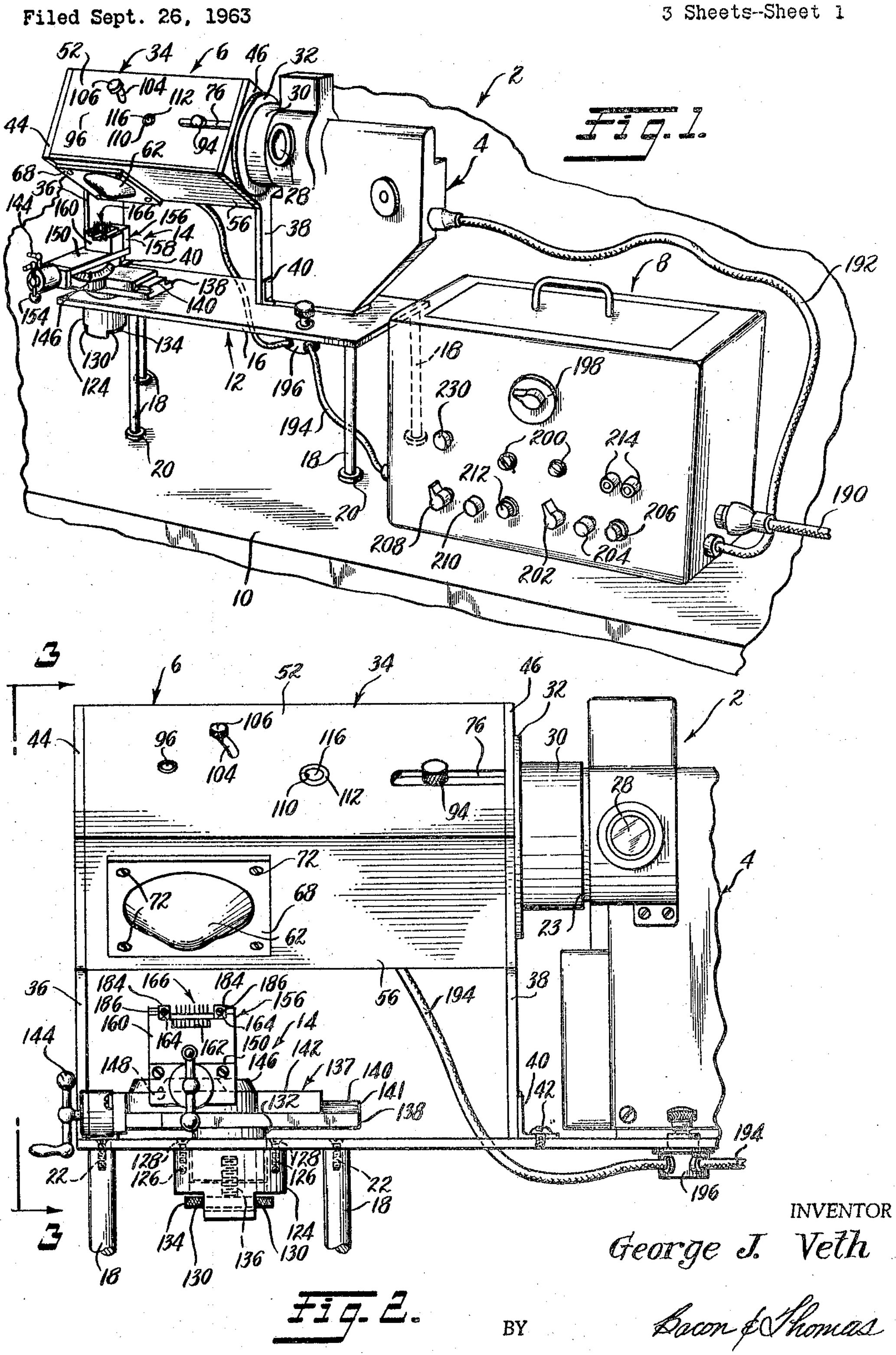
FIG. 1 is a perspective view of the optical soldering apparatus of the invention, with an electronic module in position for making soldered connections.
FIG. 2 is an enlarged, fragmentary, front elevational view showing the radiant energy concentrating apparatus and the workpiece holding and positioning fixture of FIG. 1, the concentrating apparatus being shown connected to the arc chamber of an arc lamp.

Referring now to the drawings, the optical soldering apparatus of the invention is indicated generally at 2, and comprises an electric arc lamp 4 positioned with the arc chamber thereof exhausting into a radiant energy concentrating apparatus 6. A control box for the optical soldering apparatus 2 is indicated at 8, said box resting upon a suitable supporting surface 10. A stand 12 is disposed to rest on the surface 10 to the left of the control box 8, and supports the arc lamp 4 and the radiant energy concentrating apparatus 6. The stand 12 also has a workpiece holding and positioning fixture 14 mounted thereon below the apparatus 6.

The stand 12 includes a rectangular plate 16 having a plurality of cylindrical legs 18 projecting downwardly therefrom, said legs 18 terminating in circular feet 20 and being secured to the plate 16 by screws 22 (FIG. 2). The arc lamp 4 is secured to the top surface of the plate 16 near one end thereof, and can be any suitable commercially available unit capable of emitting the desired quality and amount of infra red radiant energy, and visible light; typically, the arc lamp 4 can be a 4.5 ampere Bausch & Lomb mechanical feed arc lamp, equipped with 6.4 mm. cored carbon rods.

Figure 4:
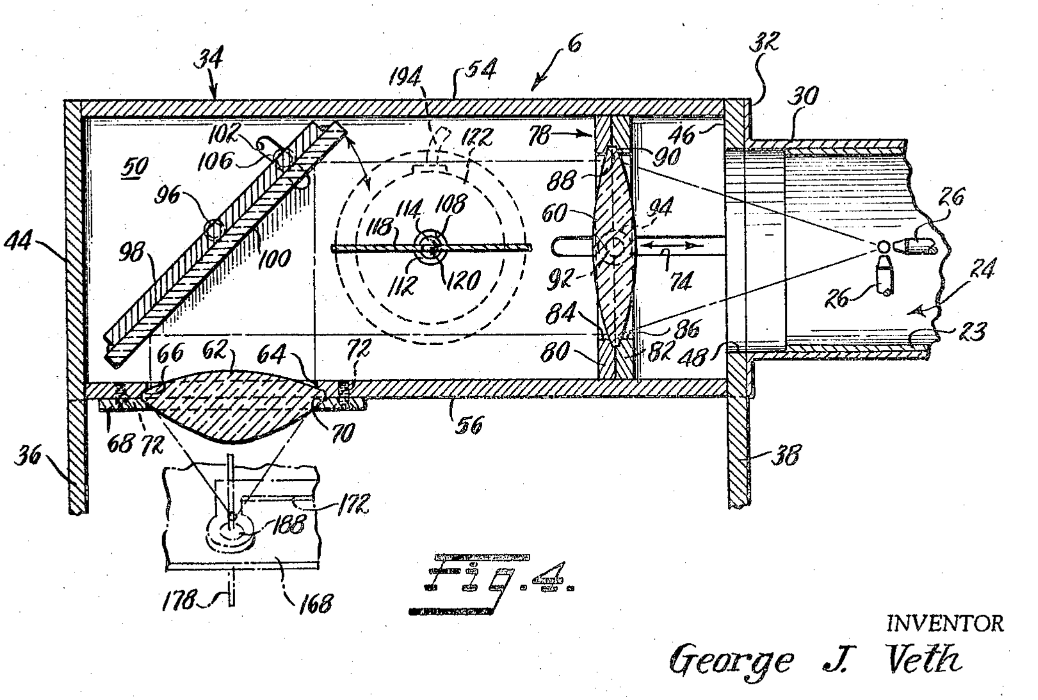
FIG. 4 is an enlarged, longitudinal sectional view, taken along the line 4—4 of FIG. 3, showing the optical system of the invention with the shutter plate in its open position, a workpiece being indicated in enlarged, phantom view below the focusing lens.

The arc lamp 4 includes a generally cylindrical housing 23 that defines an arc chamber 24, within which cham-24 is disposed a pair of carbon rod electrodes 26 (FIG. 4). The cylindrical housing 23 is provided with a suitable window 28 for viewing arc operation within the chamber 24, and a cylindrical sleeve 30 is telescoped over the open, outlet end of said housing. The sleeve 30 has a radially extending flange 32 on the end thereof, and is positioned with the flanged end in engagement with the concentrating apparatus 6.

The apparatus 6 includes a housing 34, said housing including a pair of end plates 36 and 38. The plates 36 and 38 have angle irons 40 secured to the lower ends thereof, which are in turn secured to the plate 16 by screws 42, so that the end plates 36 and 38 project normally upwardly from said plate 16. The upper ends of the plates 36 and 38 include rectangular portions 44 and 46, respectively, the four sides of said portions 44 and 46 being disposed at about a 45-degree angle to the horizontal.

The right-hand plate 38 has a cylindrical opening 48 therein, positioned in alignment with the arc chamber 24. Rectangular back, front, top and bottom plates 50, 52, 54 and 56, respectively, are secured between the end plates 36 and 38 by screws 58, and together with said end plates 36 and 38 define a rectangular chamber which is placed in communication with the arc chamber 24 by the opening 48.

Mounted within the housing 34 is the optical system of the invention, said system including a collimating lens 60 and a focusing lens 62. The bottom plates 56 of the housing 34 has a cylindrical opening 64 therein near one end thereof, said opening being provided with a downwardly-facing counterbore 66. The periphery of the focusing lens 62 is partially received within the counterbore 66, and said lens is held in position by an annular retainer ring 68 having a counterbore 70 in the upper surface thereof. The retainer ring 68 is secured to the bottom plate 56 by screws 72.

The back and front plates 50 and 52 have longitudinally extending, medially positioned, confronting slots 74 and 76, respectively, therein extending inwardly from the end plate 38. Received within the housing 34 in the region of the slots 74 and 76 is a rectangular lens holder 78, comprising a pair of rectangular plates 80 and 82 having aligned circular openings 84 and 86, respectively, therethrough. The plates 80 and 82 have confronting counterbores 88 and 90 therein, which together define a recess for receiving the peripheral edge of the collimating lens 60. The plates 80 and 82 are secured together by suitable means (not shown), and bolts 92 having knurled heads 94 thereon are passed through the slots 74 and 76, and are threaded into bores in the opposite sides of the plates 80 and 82. The lens holder 78 can thus be slid through the length of the slots 74 and 76 by grasping the knurled heads 94 of the untightened bolts 92, and can be secured in any desired position by merely tightening the bolts 92.

The collimating lens 60 is disposed at a right angle to the focusing lens 62, and therefore means must be provided to redirect rays emanating from the lens 60 through the lens 62. A pair of aligned stub shafts 96 are received within aligned openings in the back and front plates 50 and 52, and are positioned above the longitudinal axis of the lens element 60 and to the left of the longitudinal axis of the lens element 62. A rectangular plate 98 is secured between the shafts 96, and has a mirror 100 secured to the downwardly directed face thereof. The mirror 100 is thus positioned so that rays emanating from the lens 60 can be directed downwardly through the focusing lens 62.

To facilitate adjustment of the mirror 100, the back and front plates 50 and 52 are provided with arcuate slots 102 and 104 near the upper end of the plate 98, and bolts 106 are passed through said slots and are threaded into bores provided in said plate 98. The mirror 100 can thus be tilted through the length of the slots 102 and 104 to the correct angle for properly reflecting rays from the lens 60 through the lens 62, and can thereafter be secured in position by tightening the bolts 106.

It is thus seen that infra red and visible light radiant energy emanating from the arc chamber 24 will pass through the opening 48, be collimated by the lens 60, and then be reflected by the mirror 100 downwardly through the focusing lens 62. The focusing lens 62 is positioned to focus the high intensity, concentrated infra red radiant energy into a small hot spot, which would typically have a diameter of about 0.150 inches. The temperature attainable within the small focused hot spot will be sufficient to melt solder upon which it impinges, given a sufficiently powerful radiation source and an exposure time of sufficient length. The temperature in the soldering, or hot spot, region can be controlled at least in part by controlling the intensity of the focused, concentrated radiant energy.

The intensity of the concentrated radiant energy can be controlled in several ways, such as by manipulating an element of the optical system, or by varying the output intensity of the radiant source. However, it has been found that a most convenient and effective means for controlling the intensity of the concentrated radiant energy beam of an arc lamp is by the use of a shutter mechanism.

Referring again to the drawings, the back and front plates 50 and 52 have aligned bores 108 and 110 therein positioned about midway between the lens 60 and the mirror 100, said bores 108 and 110 being disposed so that a line passing through the centers thereof will intersect the longitudinal axis of the lens 60. Received within the bores 108 and 110 are bearings 112, and a pair of stub shafts 114 and 116 are in turn received within said bearings. The stub shafts 114 and 116 are secured to the opposite edges of a rectangular, relatively thin shutter plate 118.

The shutter plate 118 is provided with a small central aperture 120, and when in its open position with the thinness thereof presented to the oncoming radiation (FIG. 4) offers substantially no obstruction to radiant energy passing thereover. When the shutter plate 118 is rotated 90 degrees from the position shown in FIG. 4 to its closed position, the rectangular frontal area thereof will be positioned toward and will block the passage of nearly all rays emanating from the lens 60 except for a small portion thereof passing through the aperture 120. The small portion of radiant energy passing through the aperture 120, which contains visible light rays, will be reflected from the mirror 100 downwardly through the lens 62, and will form a spot of light that can be utilized to position workpieces for soldering; however, the low intensity of infra red radiant energy passing through the aperture 120 is far less than is needed to effect melting of solder. It should be noted that focused radiant energy from the aperture 120 will be focused along an axis lying coincident with the axis of the high intensity radiant energy present when the shutter plate 118 is in its open position.

Figure 3:
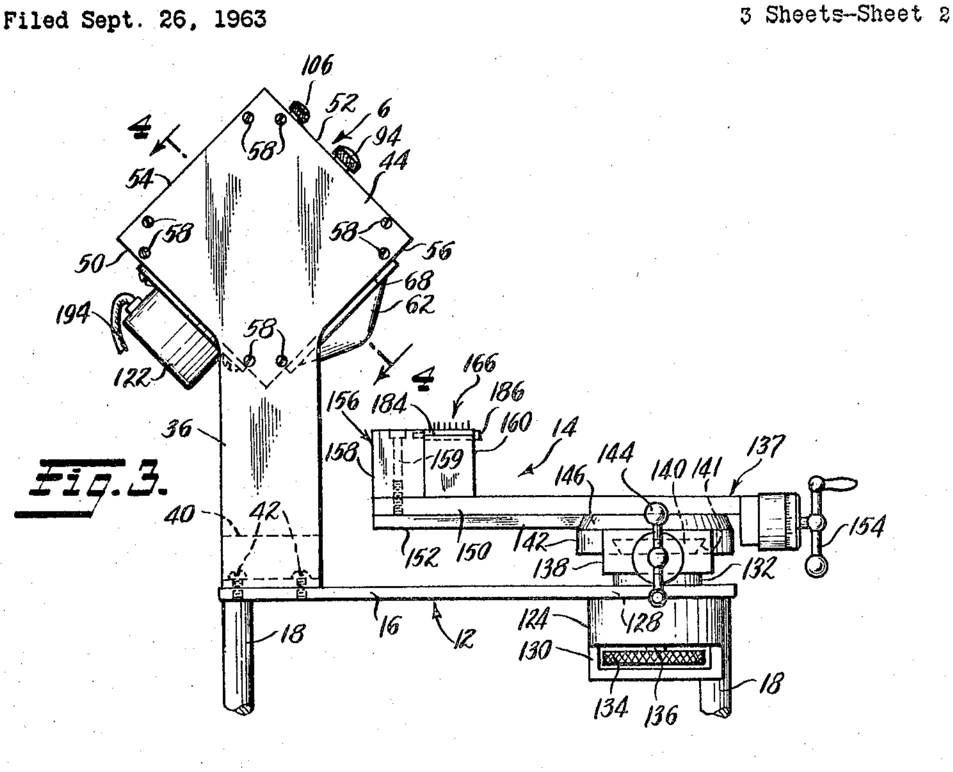
FIG. 3 is an end elevational view, taken along the line 3—3 of FIG. 2, showing in particular the relative geometric dispositions of the radiant energy concentrating apparatus and the workpiece holding and positioning fixture.

The shutter plate 118 is rotated through 90 degrees to move from the open position of FIG. 4 to a closed position. Referring to FIG. 3, a rotary electric solenoid 122 is secured to the back plate 50, and is connected to the stub shaft 114 and arranged to rotate the shutter plate 118 through 90 degrees from a closed position to an open position when activated. The solenoid 122 is connected into the control circuitry of the invention, as will be hereinafter described.

It is thus apparent that the shutter plate 118 can be readily operated to control the intensity of concentrated infra red radiant energy impinging on the workpieces. By varying the time that the shutter plate 118 is open, the temperature attained in the soldering region on the workpieces can be precisely controlled, assuming a constant source of radiant energy. This temperature is, of course, affected by the thermally conductive paths on the workpieces leading from the heated area, a variable which must be taken into account when determining open shutter time for a particular soldering job.

To provide for proper alignment between the workpieces and the beam of concentrated radiant energy emanating from the focusing lens 62, the workpiece holding and positioning fixture 14 is mounted on the stand 12 below the housing 34. The fixture 14 includes a cylindrical housing secured to the undersurface of the plate 16 by screws 126 (FIG. 2), the upper open end of said cylindrical housing being positioned in alignment with a circular opening 128 in the plate 16. The housing 124 is closed at its lower end, and a pair of diametrically opposed sections are cut away from the lower end thereof to define notches 130 which communicate with the cylindrical interior of said housing.

Received within the housing 124 and projecting upwardly therefrom through opening 128 is a cylindrical standard 132. The standard 132 fits closely within the housing 124, and a knurled disk 134 and vertical threaded shaft 136 are arranged to adjust the vertical height of the upper end of the standard 132 above the top surface of the plate 16. As is best shown in FIG. 2, the periphery of the knurled disk 134 projects into the open area defined by the notches 130, and hence said disk can be readily manipulated to raise and lower the standard 132.

Secured to the upper end of the standard 132 is a conventional lathe compound 137, including a longitudinal way 138 fixed to said standard. The way 138 has a rib 140 on the top surface thereof, including inwardly tapered lateral edges 141. A longitudinal carrier 142, having a notch in the underside thereof receivable on the rib 140, is slideably disposed on the longitudinal way 138, and is adjustable thereon by means of a threaded shaft (not shown) and a crank 144 in the conventional manner.

A carrier disk 146 is pivotally mounted on the longitudinal way 138 and has a notch 148 therein having angled side walls. Disposed to rest on the disk 146 is a transverse carrier 150, having a rib 152 on the undersurface thereof receivable within the notch 148. The transverse carrier 150 is movable by a threaded shaft (not shown) and a crank 154 in the conventional manner, and can be adjusted to lie at various angles with respect to the longitudinal carrier 142. Because the structure of the lathe compound 137 is conventional, it will not be further described.

Mounted on one end of the transverse carrier 150 is a holding jig 156, said jig including a rectangular rear block 158 that is secured to said carrier by bolts 159 (FIG. 3). A front block 160 is secured to the block 158, and has a centrally positioned, rectangular recess 162 in the top surface thereof which extends parallel with the longitudinal axis of the transverse carrier 150. Disposed on opposite sides of the central rectangular recess 162 are a pair of rectangular recesses 164 of substantially less depth than said recess 162; the bottom faces of the recesses 164 function to support an electronic module 166 for soldering.

Figure 5:
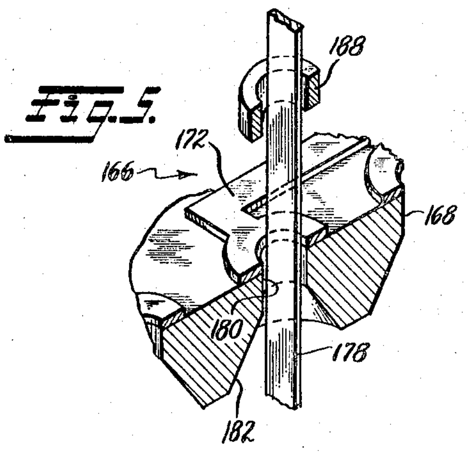
FIG. 5 is a greatly enlarged, exploded fragmentary, perspective view showing a circuit board, an electronic component lead, and a preformed solder ring.
Figure 6:
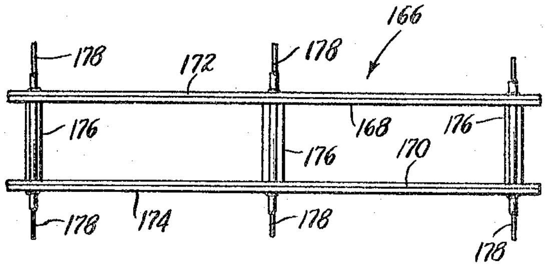
FIG. 6 is a front, elevational view of a typical electronic module.

Referring to FIGS. 5 and 6, the electronic module 166 includes a pair of spaced upper and lower circuit boards 168 and 170, respectively. The circuit boards 168 and 170 have conventional printed, or etched, circuitry 172 and 174 formed on the upper and lower faces, respectively, thereof. Positioned between the boards 168 and 170 are a plurality of electronic elements 176, such as transistors and the like. The elements 176 have rectangular electrical leads 178 extending vertically from the upper and lower ends thereof, which leads pass through cylindrical bores 180 in the circuit boards. The lower ends of the bores 180 in the upper board 168, and the upper ends of the bores 180 in the lower circuit board 170, include frusto-conical portions 182, which facilitate assembly of the module. In certain applications it is desirable to have another circuit board in engagement with the lower surface of board 168 or the upper surface of board 170; in these instances, the bore portions 182 also create a chamber for receiving soldered connections on the adjacent board.

The module 166 is placed in the holding jig 156 with the lower one of the circuit boards 168 and 170 resting on the bottom faces of the recesses 164; the downwardly projecting leads 178 are then received within the longitudinal rectangular recess 162, which has a depth sufficient to accommodate said leads. The holding jig 156 is constructed to accommodate modules 166 of different widths, and to secure each module in a fixed position. For this purpose, a pair of longitudinally extending, rectangular bars 184 are received within the recesses 164, and are secured to the rear block 158 by screws 186 extending axially through said rectangular bars. By using bars 184 of varying widths, it is obvious that modules 166 of different widths can be accommodated within the holding jig 156.

To practice the technique of the invention, the elements 176 of the module 166 are first assembled between the circuit boards 168 and 170, with the leads 178 projecting through their associated bores 180. Preformed solder washers 188 are then positioned over each of the leads 178 projecting upwardly from the upper circuit board 168, and the entire assembly is then placed in the holding jig 156.

The close tolerances and small dimensions associated with the leads 178, the circuitry 172 and 174, and the preformed solder rings 188 require precise positioning of the module 166 for soldering. While the dimensions of these elements will vary, a typical module 166 would include circuit boards 168 and 170 having bores 180 therethrough possessing a diameter of 0.0150 inch, in which instance the rectangular lead 178 would typically measure 0.010 inch by 0.003 inch in cross-section, and would be made from gold flashed kovar or tinned copper. The preformed solder ring 188 will typically be made from a composition comprising 60 percent tin and 40 percent lead, and will have an axial length of 0.010 inch; the inner and outer diameters for the solder ring 188 would be 0.0150 inch and 0.0250 inch, respectively, for the given example.

After the unsoldered module 166 is placed in the holding jig 156, the arc lamp 4 is activated with the shutter plate 118 in its closed position. The cranks 144 and 154 are then manipulated to focus the lower intensity, visible radiant energy emanating from the housing 34 onto one of the solder washers 188; to insure precise alignment, a binocular microscope or other like optical instrument can be utilized to facilitate this operation.

After the solder washer 188 is properly positioned relative to the beam of concentrated radiant energy, a suitable flux is placed on the region of the proposed connection, which flux can be any commercially available, low viscosity, high temperature flux suitable for use on copper. The solenoid 122 is then activated to move the shutter plate 118 to its open position, with the thinness thereof presented to the oncoming radiant energy. A high intensity beam of infra red radiant energy is thereby concentrated on the solder washer 188, and is maintained focused on said washer for a period of time sufficient to effect melting thereof and making of the desired connection. It has been found that when utilizing a 4.5 ampere mechanical fed arc lamp equipped with 6.4 mm. cored carbon rods, a hot spot of concentrated focused radiant energy having a 0.150 inch diameter will attain a steady state temperature of about 800° F., depending on the thermal characteristics of the workpiece. For these conditions, it has been found that an open shutter time of about 3 seconds is sufficient to effect making of a good solder connection of the dimensions in FIG. 5.

After completion of a soldered connection, the solenoid 122 is operated to return the shutter plate 118 to its closed position. The cranks 144 and 154 are then manipulated to move the module 166 to the next soldering position, and so on. After soldering has been completed on the upper circuit board 168, the module 106 is taken from the holding jig 156, is inverted, and is again placed in said jig. Solder washers 188 are then placed in position on the leads 178 projecting upwardly from the board 170, and the process steps described hereinabove are again repeated.

It is thus seen that apparatus has been provided for making soldered connections by the use of radiant energy, and that no physical contact is required between the heat source and the solder washers 188; because no physical contact is required, the possibility of damage occurring to the electronic module during soldering is minimized. Further, the apparatus of the invention is constructed to precisely position the region of a proposed soldered connection relative to a beam of radiant energy, whereby soldering is confined to a preselected desired area. In addition, the shutter apparatus for controlling the intensity of the radiant energy provides for precise control of the soldering temperature, thereby avoiding damage from overheating to the elements of the module 166.

The amount of heat generated in the soldering region is to a great extent controlled by the period of time that the shutter plate 118 remains in an open position. It is thus necessary to provide precise control over the movements of the shutter plate 118, if like precise control is to be exercised over the soldering temperature. The present invention includes circuitry for automatically controlling the shutter's open time, and which allows for manual operation when desired.

Figure 7:
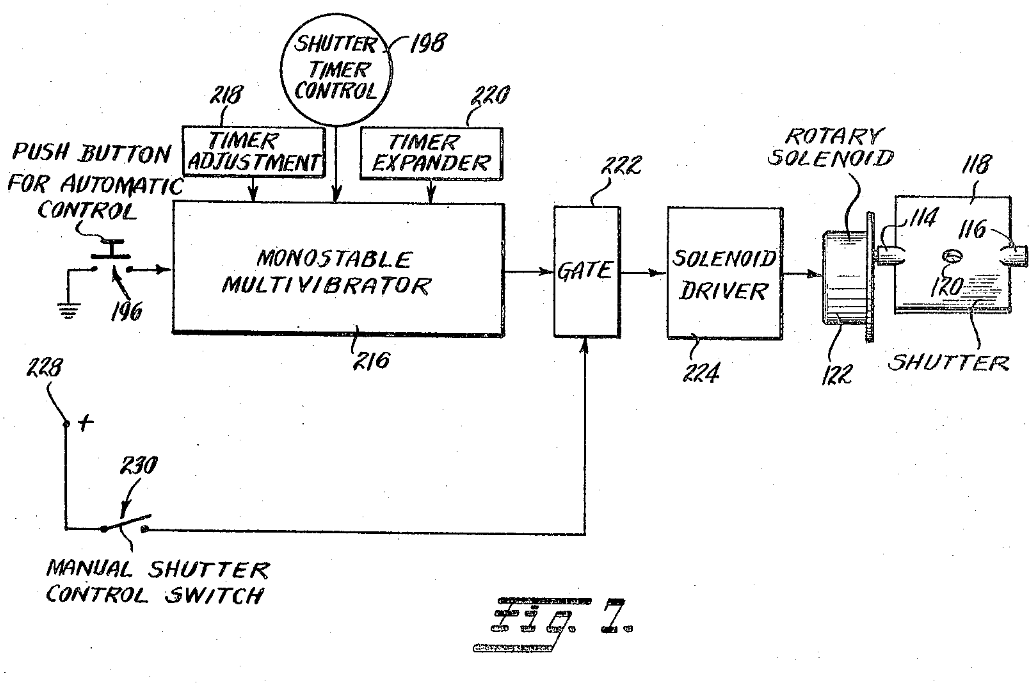
FIG. 7 is a block, schematic diagram of the time control portion of the circuitry associated with the optical soldering apparatus.

Referring to FIGS. 1 and 7, the control box 8 houses most of the circuitry of the invention, and is supplied with power by a cable 190 which is connected to a suitable source. A connecting cable 192 extends from the control box 8 to the arc lamp 4, and provides electrical energy thereto. Another cable 194 extends from the control box 8, through a switch 196 mounted on the plate 16 of the stand 12, and to the electrical solenoid 122. The switch 196 is connected to provide automatic operation of the soldering apparatus.

The control box 8 has a shutter time-setting dial 198 thereon, which is connected to suitable circuitry for providing any one of a wide variety of time intervals. Positioned below the dial 198 are a pair of calibrating screws 200 for adjusting the timing apparatus associated with said dial.

An "ON-OFF" switch 202 is mounted on the front panel of the control box 8, and is connected in series with a current-limiting resistor to the arc lamp 4. The control circuit for the arc lamp 4 also includes a fuse receivable within a mounting 204 disposed adjacent the switch 202, and a signal light 206 is provided to indicate when the switch 202 is in an "ON" position.

The timer portion of the control circuitry of the invention is controlled by an "ON-OFF" switch 208, with which is associated a fuse mounting 210 and a signal light 212. The front panel of the control box 8 is also provided with a pair of terminals 214, to which suitable capacitors can be connected for providing a greater range to the timer apparatus.

The timer portion of the control circuitry is shown schematically in block form in FIG. 7, and is of conventional construction. The timer circuitry includes a monostable multivibrator 216, to which is connected the time-setting dial 198, a timer adjustment 218, and a timer expander 220. The output of the multivibrator 216 passes through a gate 222 to a solenoid driver 224, the latter being connected to the rotary solenoid 122.

The switch 196 is connected between ground and the monostable multivibrator 216, and when closed will automatically cycle the shutter plate 118 through the time period established on the time-setting dial 198. Another switch 230 is mounted on the front panel of the control box 8, and is connected between a positive terminal 228 and the gate 222. The switch 230 is connected for manually operating the shutter plate 118 independently of the automatic switch 208.

It is thus seen that a radiant energy soldering technique and apparatus have been provided capable of fulfilling each of the objects hereinabove set forth. The invention readily lends itself to the repeated making of soldered connections on miniature electronic products, although it is not limited to this use. Further, the apparatus of the invention is relatively economical to construct, and provides reliable operation.

Obviously, many modifications and variations of the present invention are possible in the light of the above teachings. It is, therefore, to be understood that within the scope of the appended claims the invention may be practiced otherwise than as specifically described.

I claim:

1. Apparatus for effecting melting of a body of solder positioned at a juncture between workpieces, whereby to make a soldered connection, comprising: an electric arc source of infra red radiant energy, said source being spaced from said workpieces and said body of solder; means for concentrating radiant energy emanating from said source into a high intensity beam and for varying with time the intensity of the concentrated beam, comprising: a housing supported adjacent said source; a lens system mounted within said housing, and arranged to concentrate said radiant energy into a high intensity beam and to direct said beam toward said workpieces; shaft means rotatably mounted within said housing, the axis of said shaft means extending transversely to the direction of travel of radiant energy passing thereover; a relatively thin shutter plate secured to said shaft means and having a relatively large frontal area, said plate also having a small central aperture therein; and a rotary solenoid mounted on said housing and connected to said shaft means, and arranged when activated to rotate said shaft means from a position wherein the frontal area of said plate is presented to said radiant energy to a position wherein the thinness of said disk is so presented; adjustable timer means connected with said solenoid, and arranged to coact therewith for moving said shutter between said two positions to vary with time the intensity of the concentrated beam of radiant energy directed toward said workpiece; and means spaced from said housing for supporting said workpieces, said means being adjustable to move said workpieces relative to said concentrated radiant energy beam, and to position said body of solder in alignment with said beam.

2. A method for making a soldered connection between an electrical lead and a printed circuit board, said board having a bore therethrough in the region of said connection through which said lead projects, comprising the steps of: mounting the circuit board in a jig with said lead projecting upwardly through said bore; placing an annular body of solder on said upwardly projecting lead and in engagement with the upper surface of said circuit board; focusing a high intensity, concentrated beam of radiant energy on said region for a length of time sufficient to effect melting of said annular body of solder and making of said connection, and, before focusing said high intensity beam on said region, reducing the intensity of said concentrated beam of visible radiant energy on said circuit board; and moving said circuit board to position said reduced intensity beam on said region.

3. A method for making a soldered connection between an electrical lead and a printed circuit board, by employing an apparatus having a source of infra red radiant energy, a housing supported adjacent said source to receive radiant energy therefrom, a lens system mounted within said housing and arranged to concentrate radiant energy emanating from said source into a beam directable toward a body of solder to be melted for said connection, and means for varying with time the intensity of the concentrated radiant energy beam, comprising the steps of: mounting the circuit board in a jig with said lead projecting upwardly through an aperture in said board in the region of said connection; placing an annular body of solder about said upwardly projecting lead and in engagement with the upper surface of said circuit board; focusing a low intensity, concentrated beam of radiant energy on said circuit board by manipulating said means for varying the beam intensity; moving said circuit board to position said low intensity beam on said region; and increasing the intensity of said concentrated beam of radiant energy on said region by further manipulation of said intensity varying means to effect heating by a high intensity beam of a sufficient magnitude and for a sufficient time only to produce melting of said solder and a bonding at said juncture without any physical contact by said heat source.

References Cited by the Examiner

UNITED STATES PATENTS

| | | | |
|---|---|---|---|
| 2,471,650 | 5/1949 | Pandolfi | 228—56 |
| 2,492,851 | 12/1949 | Durst et al. | 219—85 |
| 2,681,403 | 6/1954 | Twivey | 219—85 |
| 2,861,166 | 11/1958 | Cargill | 219—347 X |
| 2,927,187 | 3/1960 | Wendelken | 219—349 |
| 3,001,055 | 9/1961 | Lozier et al. | 219—349 |
| 3,103,574 | 9/1963 | Chellis et al. | 219—383 |

FOREIGN PATENTS

| | | |
|---|---|---|
| 264,814 | 12/1927 | Great Britain. |
| 738,874 | 10/1955 | Great Britain. |

ANTHONY BARTIS, *Acting Primary Examiner.*

RICHARD M. WOOD, *Examiner.*

R. F. STAUBLY, *Assistant Examiner.*